US009099327B2

(12) United States Patent
Haensch et al.

(10) Patent No.: US 9,099,327 B2
(45) Date of Patent: Aug. 4, 2015

(54) MULTIGATE STRUCTURE FORMED WITH ELECTROLESS METAL DEPOSITION

(75) Inventors: Wilfried Haensch, Somers, NY (US); Christian Lavoie, Ossining, NY (US); Christine Qiqing Ouyang, Yorktown Heights, NY (US); Xiaoyan Shao, Yorktown Heights, NY (US); Paul M. Solomon, Yorktown Heights, NY (US); Zhen Zhang, Ossining, NY (US); Bin Yang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/568,839

(22) Filed: Aug. 7, 2012

(65) Prior Publication Data

US 2012/0298965 A1     Nov. 29, 2012

Related U.S. Application Data

(62) Division of application No. 12/955,388, filed on Nov. 29, 2010, now Pat. No. 8,936,978.

(51) Int. Cl.
*H01L 29/06* (2006.01)
*H01L 21/8238* (2006.01)
*H01L 29/417* (2006.01)

(52) U.S. Cl.
CPC .... *H01L 29/0673* (2013.01); *H01L 21/823814* (2013.01); *H01L 29/41791* (2013.01)

(58) Field of Classification Search
CPC ............... H01L 21/823431; H01L 27/1211; H01L 29/785; H01L 29/66795; H01L 21/823814
USPC .......................................... 257/347; 438/197
See application file for complete search history.

(56) References Cited

U.S. PATENT DOCUMENTS

| | | | | |
|---|---|---|---|---|
| 2004/0110331 A1* | 6/2004 | Yeo et al. | | 438/199 |
| 2005/0051825 A1* | 3/2005 | Fujiwara et al. | | 257/308 |
| 2005/0167750 A1* | 8/2005 | Yang et al. | | 257/347 |
| 2005/0202618 A1* | 9/2005 | Yagishita | | 438/197 |
| 2005/0218438 A1* | 10/2005 | Lindert et al. | | 257/296 |
| 2007/0284654 A1 | 12/2007 | Rubino et al. | | |
| 2008/0001224 A1* | 1/2008 | Kinoshita et al. | | 257/346 |
| 2008/0251779 A1* | 10/2008 | Kakoschke et al. | | 257/5 |

* cited by examiner

*Primary Examiner* — Thao X Le
*Assistant Examiner* — Geoffrey Ida
(74) *Attorney, Agent, or Firm* — Louis J. Percello, Esq.

(57) ABSTRACT

A multigate structure which comprises a semiconductor substrate; an ultra-thin silicon or carbon bodies of less than 20 nanometers thick located on the substrate; an electrolessly deposited metallic layer selectively located on the side surfaces and top surfaces of the ultra-thin silicon or carbon bodies and selectively located on top of the multigate structures to make electrical contact with the ultra-thin silicon or carbon bodies and to minimize parasitic resistance, and wherein the ultra-thin silicon or carbon bodies and metallic layer located thereon form source and drain regions is provided along with a process to fabricate the structure.

12 Claims, 6 Drawing Sheets

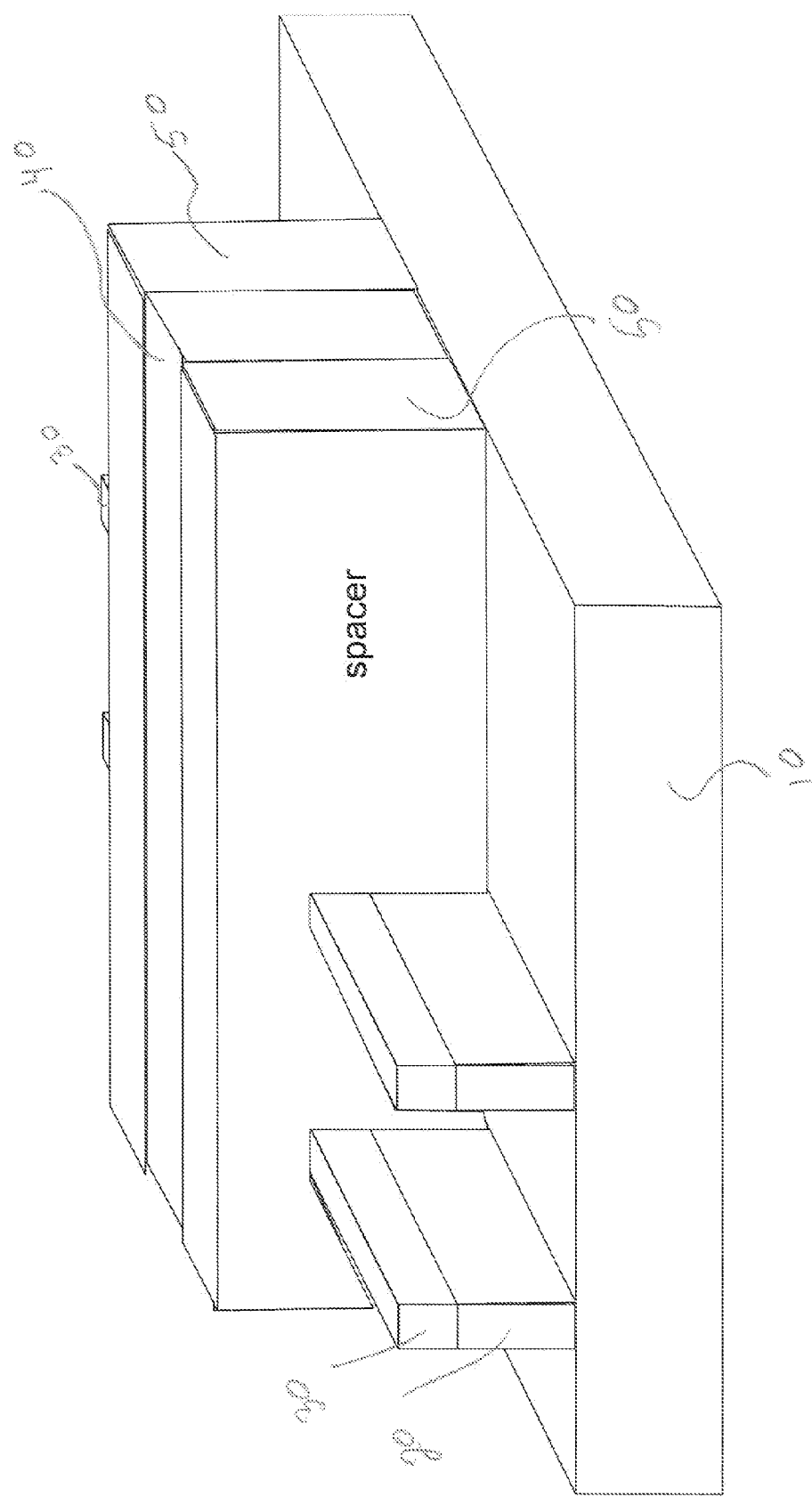

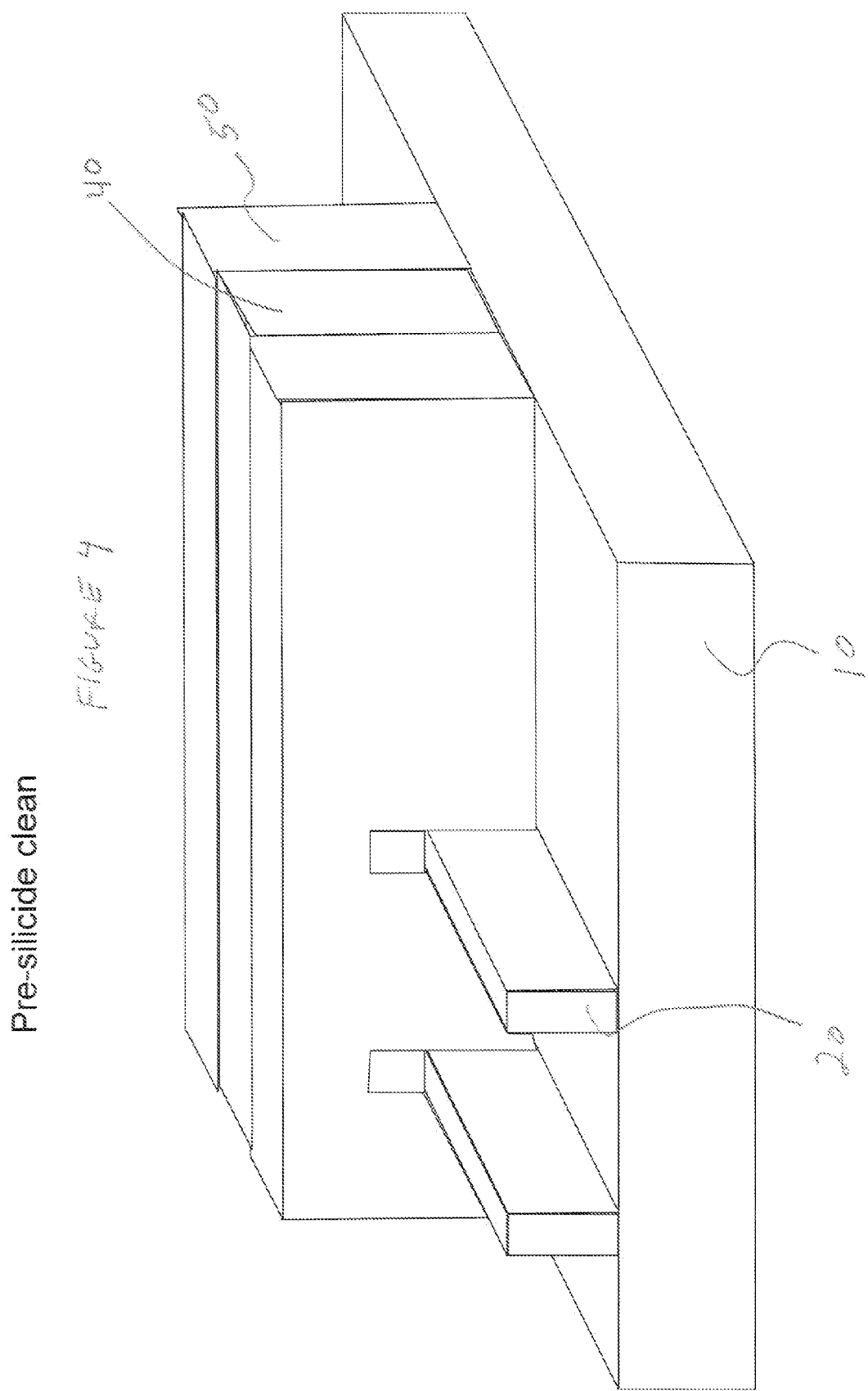

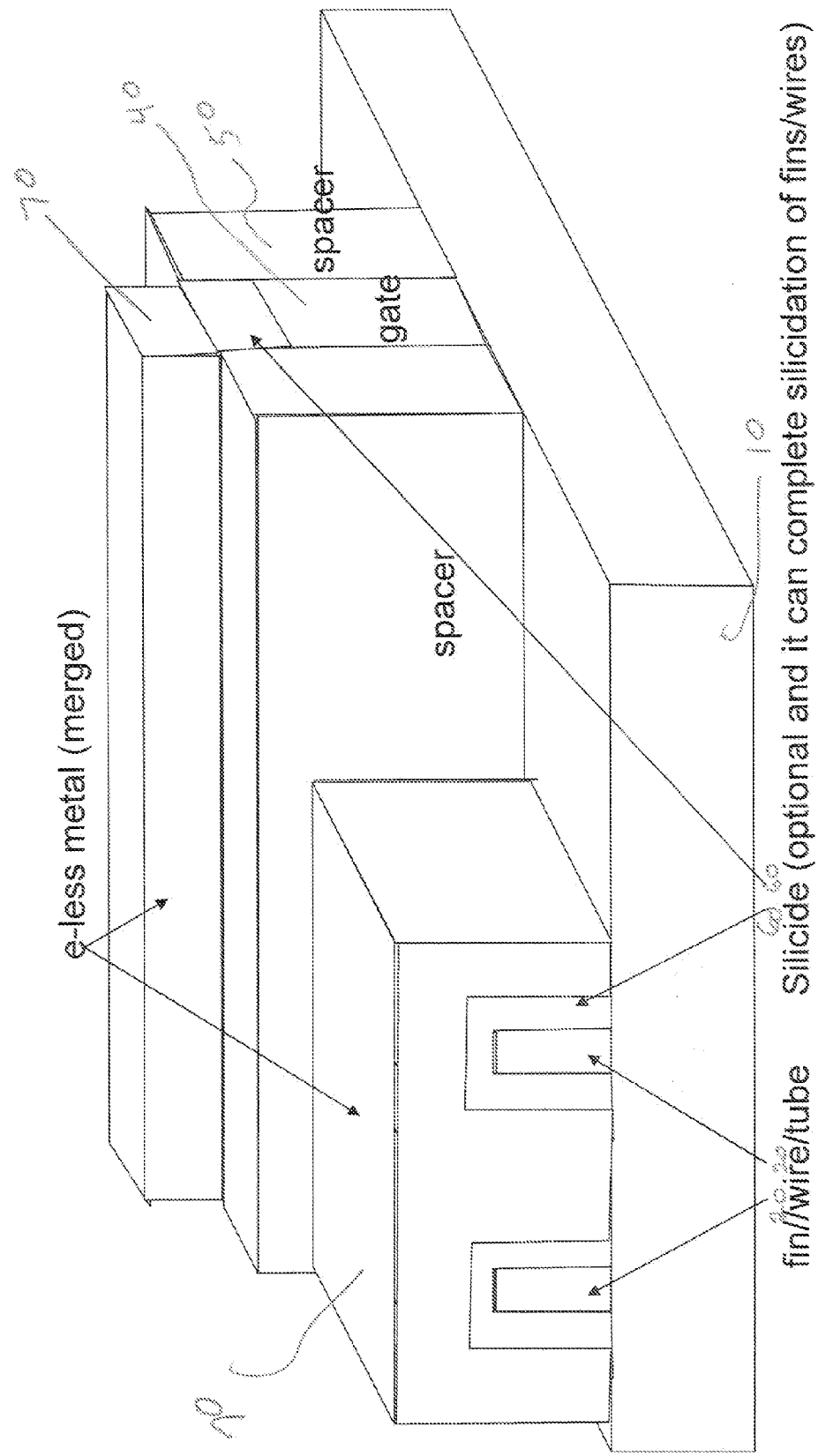

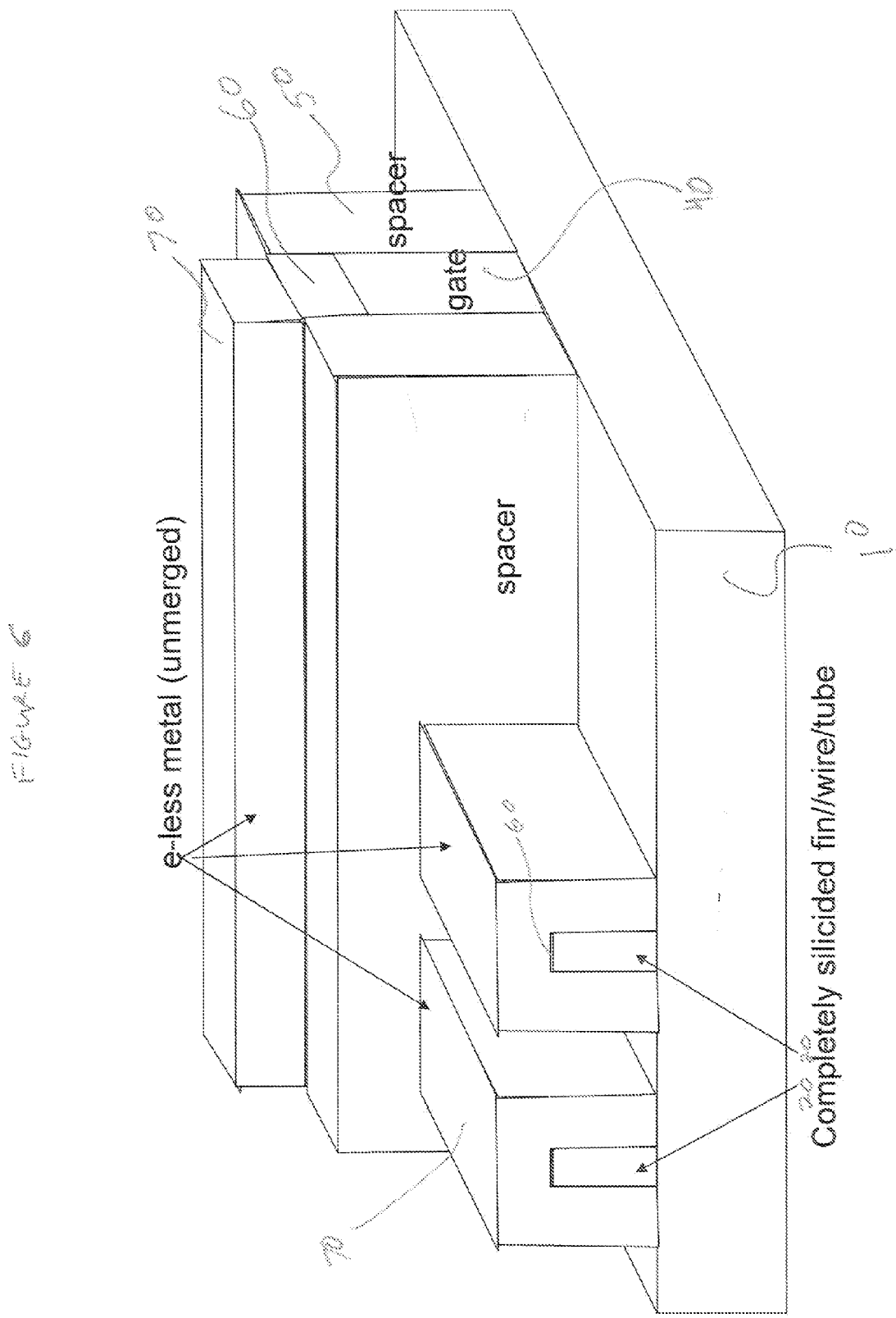

US 9,099,327 B2

MULTIGATE STRUCTURE FORMED WITH ELECTROLESS METAL DEPOSITION

RELATED APPLICATIONS

This application is a divisional of co-pending application Ser. No. 12/955,388, filed on Nov. 29, 2010, and for which priority is claimed under 35 U.S.C. §120, the entire contents of which are hereby incorporated by reference.

TECHNICAL FIELD

The disclosure relates to a multigate structure formed with electroless metal deposition on ultra-thin silicon (Si) or carbon or III-V bodies for minimizing parasitic resistance and for making contact to these thin bodies. In particular, the disclosure relates to a selective metal electroless deposition method on the ultra thin Si or carbon (C) body or III-V body (fins, nanowires, or nanotubes), in which the metal is only deposited on a conducting surface such as a silicided area or heavily doped regions.

BACKGROUND OF THE DISCLOSURE

In microelectronics, multigate devices such as trigate, finfet, nanowires, and nanotubes have been promising for device scaling due to superior electrostatics. However, these devices are more prone to parasitic resistance due to the extremely thin Si or carbon (C) body or III-V body (less than 20 nm) and current crowding with the 3-dimensional architectures. In order to reduce the parasitic resistance and also to enable contact, these thin Si bodies (fins, wires, or cubes) are usually merged with epitaxial (epi) Si or SiGe(C) that is heavily doped by in situ doping and/or ion implantation, like the conventional source/drain areas, and then silicided.

However, epitaxial depositon is a complex and expensive process. In particular, it is challenging to achieve epi uniform on NFETs and PNFET, and across the wafer. Moreover, the pre-epi cleans and epitaxial growth conditions are very sensitive to the dopant species, and their concentration at the re-growth interface requires extensive optimization. In addition, the epi process requires a capping layer on the poly gate (or poly or a-Si portion of high-k metal gates), which requires additional process steps and significantly constrains the device design and process integration.

In the method of the disclosure, a metallic film is selectively deposited on top of a source/drain and gate regions using an electroless deposition technique, in which parasitic external resistance is decreased. This approach is completely compatible with conventional high performance CMOS flows, and eliminates the added complexity and cost of a conventional epi RSD process.

SUMMARY OF THE DISCLOSURE

In summary, the disclosure relates to a multigate structure formed with selective electroless metal deposition on ultra-thin Si or carbon bodies for minimizing parasitic resistance (i.e., external parasitic source drain resistance) and make contact to these thin bodies. The process is fully compatible with a conventional CMOS flow for Co or Ni or NiPt silicide.

In one aspect of the disclosure, a selective metal electroless deposition method is used to merge or partially merge the ultra thin Si or C body, e.g., fins, nanowires, or nanotubes, in which the metal alloy film is only deposited on a conducting surface such as silicided area or heavily doped regions.

In particular, the process of the present disclosure comprises forming a multigate structure which comprises:
providing an ultra-thin silicon or carbon bodies of less than 20 nanometers thick on a semiconductor substrate,
forming multigate structures on the substrate,
forming dielectric spacers electrically isolating the multigate structures from the ultra-thin silicon or carbon bodies,
electrolessly depositing metallic layer selectively on the side surfaces and top surfaces of the ultra-thin silicon or carbon bodies and on the multigate structures to make electrical contact with the ultra-thin silicon or carbon bodies and to minimize parasitic resistance, wherein the electrolessly deposited metallic layer and ultra-thin silicon or carbon bodies form source and drain regions.

A further aspect of the present disclosure relates to a multigate structure which comprises:
a semiconductor substrate;
an ultra-thin silicon or carbon bodies of less than 20 nanometers thick located on the substrate;
an electrolessly deposited metallic layer selectively located on the side surfaces and top surfaces of the ultra-thin silicon or carbon bodies and selectively located on top of the multigate structures to make electrical contact with the ultra-thin silicon or carbon bodies and to minimize parasitic resistance, and wherein the ultra-thin silicon or carbon bodies and metallic layer located thereon form source and drain regions.

Still other objects and advantages of the present disclosure will become readily apparent by those skilled in the art from the following detailed description, wherein it is shown and described only the preferred embodiments, simply by way of illustration of the best mode. As will be realized, the disclosure is capable of other and different embodiments, and its several details are capable of modifications in various obvious respects, without departing from the disclosure. Accordingly, the description is to be regarded as illustrative in nature and not as restrictive.

BRIEF DESCRIPTION OF THE DRAWINGS

FIGS. 1-5 illustrate a structure according to the present disclosure in during various steps of the fabrication process of the present disclosure.

FIG. 6 is an isometric view of an embodiment of a structure according to the present disclosure.

DETAILED DESCRIPTION OF THE DISCLOSURE

A more complete appreciation of the disclosure and many of the attendant advantages will be readily obtained, as the same becomes better understood by reference to the following detailed description when considered in connection with the accompanying drawings.

Figure 1:
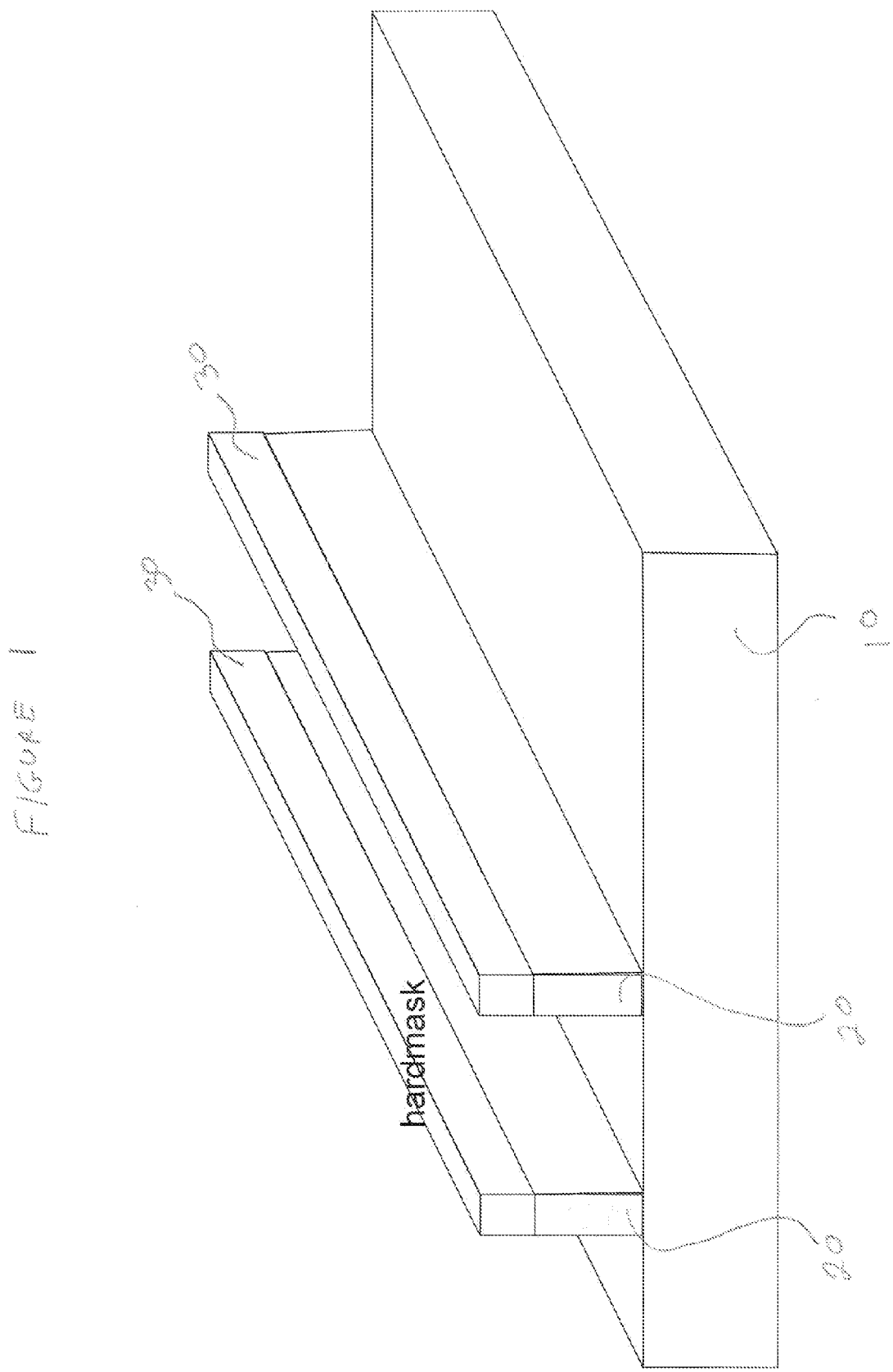

FIG. 1 illustrates a semiconductor substrate 10 having ultrathin silicon or carbon body 20 delineated thereon and having a hardmask 30 delineated on the top surfaces of fins 20. Examples of substrate 10 include Si, SiC and SOI substrates.

The ultrathin silicon or carbon body 20 is typically less than 20 nanometers thick and is more typically less than 10 nanometers thick. The ultrathin silicon or carbon bodies 20 are typically fins, nanowires or nanotubes.

The hardmask layer 30 may be deposited by any process including solution based processes including spin coating, spray coating, dip coating, and scan coating or by vapor deposition processes including chemical vapor deposition, physical deposition, sputtering, evaporation, and plasma enhanced chemical vapor deposition. The hardmask layer 30 may be comprised of a silicon oxide, silicon carbide, silicon nitride or high-k dielectric materials. The hardmask layer 30 is often as referred to gate dielectric and has a thickness of 1-10 nm.

Figure 2:
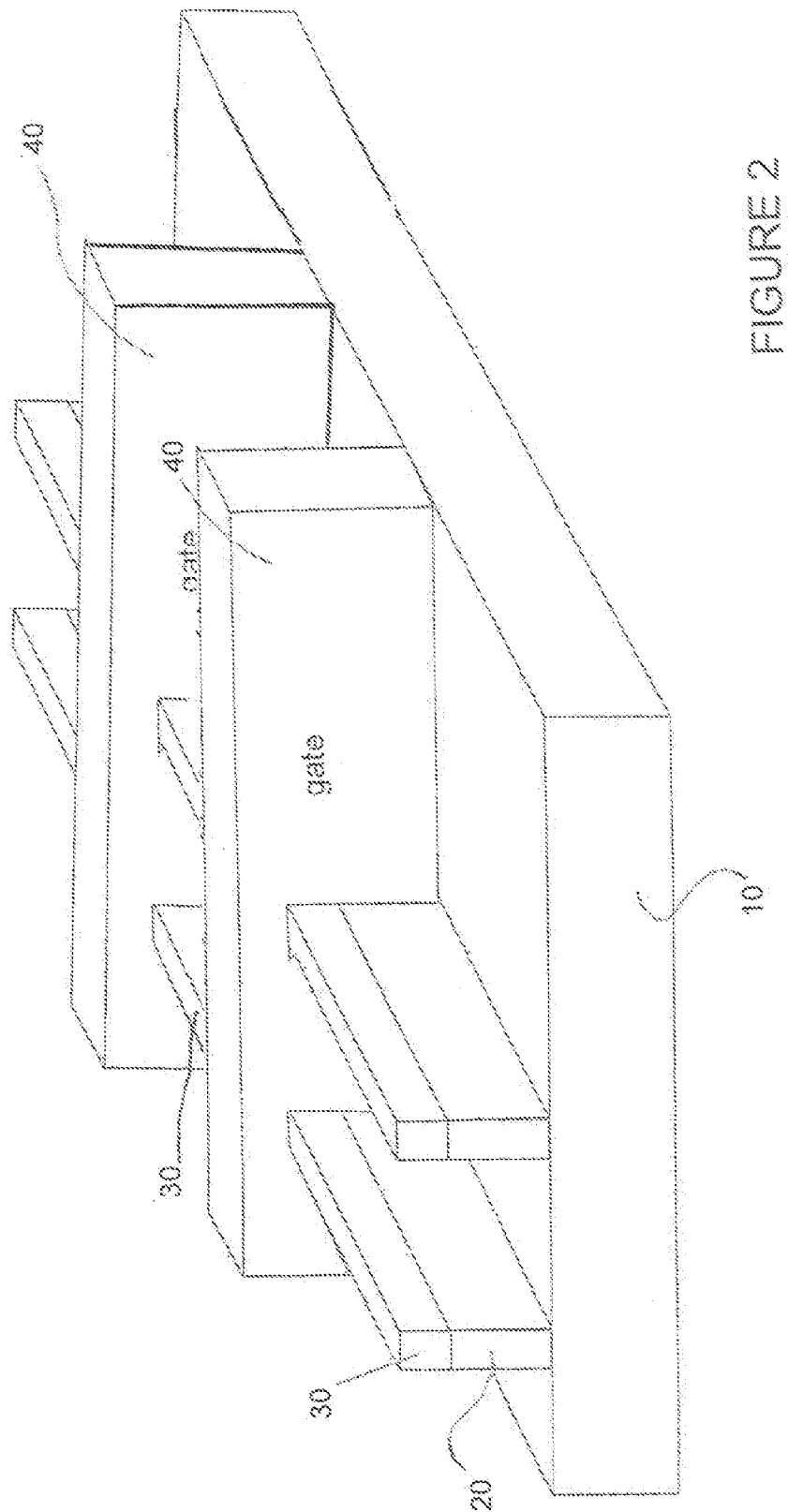

FIG. 2 illustrates proving a gate 40 located between the ultrathin silicon or carbon bodies 20 and located on top of hardmask 30 and substrate 10. The structure according to the present disclosure comprises a plurality of gates 40, with only one being shown to facilitate an understanding of the present disclosure. The gates can be any of the typical gate materials and include doped polycrystalline silicon or metal gate.

FIG. 3 illustrates providing spacers 50 that sandwich gate 40 and being located on top of hard mask 30 and substrate 10. Spacers 50 electrically isolate gates 40 from ultrathin silicon or carbon bodies 20. The spacers 50 typically include dielectric materials such as silicon dioxides. The spacers 50 are typically about 10 nanometers to about 20 nanometers thick.

FIG. 4 illustrates removal of hardmask 30 from the top of the ultrathin silicon or carbon bodies 20.

FIG. 5 illustrates an embodiment of a structure according to the present disclosure. In particular an optional silicide layer 60 is provided on top of gate 40 and on top of and on the sidewalls of ultrathin silicon or carbon body 20. The silicide layer 60 is typically less than about 20 nanometers and more typically less than about 10 nanometers and at least about 2 nanometers and further reduces the external parasitic source drain resistance. Also in FIG. 4 an electrolessly plated metal 70 is provided selectively on top of gate 40 and on top of and on the sidewalls of fins 20 and merged therewith. In other words, in this embodiment, the electrolessly plated metal 70 electrically connects adjacent ultrathin silicon or carbon bodies 20. In this embodiment, the electrolessly plated metal 70 fills the entire space between adjacent ultrathin silicon or carbon bodies 20 (i.e., completely merged). In other embodiments, the electrolessly plated metal 70 partially fills the space height wise between adjacent ultrathin silicon or carbon bodies 20 (i.e., partially merged). The thin Si or C body 20 does not have to be completely merged or even partially with metal, in which case, a contact bar can be used instead of a contact hole.

Electroless deposition or plating generally refers to the autocatalytic or chemical reduction of aqueous metal ions to metal atoms on a substrate without application of an electrical current. Specifically, electroless metal deposition is a process of autocatalytic nucleation and growth, and typically requires a catalyst, e.g., palladium catalyst, to initiate the reaction.

Examples of materials that may be plated through the electroless process generally include copper, nickel, gold, cobalt, and tin-lead alloys. The electrolessly plated metal layer 70 is preferably a metal alloy. The substrate surface may be any surface that is either catalytically active itself or can be activated by a catalyst. For instance, the substrate may include metal, diamond, and polymeric materials, e.g., semiconductor wafers.

A selective metal electroless deposition method is used in which the metal is only deposited on a conducting surface such as silicided area or heavily doped regions.

The electroless deposition includes heating a solution to a certain deposition temperature, which generally corresponds to at least the minimum deposition temperature. Typical temperatures are about 40° C. to about 95° C. and more typically about 70° C. to about 90° C. After heating, the solution is pumped into a plating chamber. In the plating chamber, a substrate having an activated surface is present and the electroless plating begins at or near the time the plating solution contacts the substrate.

In a preferred embodiment, the deposition is usually designed to occur in a certain pH and temperature range. A typical pH range is about 7.5 to about 11.

In a preferred embodiment, the electroless plating solution is contacted with the substrate to form a deposit on the substrate. The deposit is a cobalt-tungsten alloy (CoW), such as a cobalt-tungsten-phosphorous alloy (CoWP), a cobalt-tungsten-boron alloy or a cobalt-tungsten-phosphorous-boron alloy (CoWBP).

The electroless plating solution may have a pH of about 7.5 to about 11.0, and be at a temperature of about 40° C. to about 95° C. In another preferred embodiment, the temperature of the deposition is between 40° C. to 75° C. for a phosphorous based alloy, and between 70° C. to 90° C. for a boron based alloy. These temperatures will not impact a wafer.

In a preferred embodiment, the cobalt source contained within the solution may be cobalt sulfate, cobalt chloride, or cobalt hydroxide, and tungsten source may be tungstic acid, tungsten oxide, ammonium tungstate, or phosphorous tungsten acid.

In addition to forming cobalt-tungsten alloy layers, nickel-tungsten alloy layers, cobalt-rhenium alloy layers, and nickel-rhenium alloy layers may also be formed. For instance, when forming a nickel-tungsten alloy layer, the above cobalt source can be replaced with a nickel source. Examples of nickel sources include nickel hydroxide and various soluble nickel salts such as nickel sulfate, nickel chloride, nickel sulfamate and the like. The nickel layers may include nickel phosphorus (NiP) or nickel boron (NiB) alloy.

When forming a cobalt-rhenium alloy layer, the tungsten source may be replaced with a rhenium source. Examples of rhenium sources include rhenium (VII) oxide, perrhenic acid, ammonium perrhenate, and the like.

In addition, the electroless plating solution may also contain a pH adjusting agent, a buffer, a complexing agent, a stabilizer, and one or more surfactants. Examples of pH stabilizers include an amine, an ammonium hydroxide, or a hydroxy amine. In general, the pH adjusting agent is added to the solution in order to increase the pH of the solution. The pH adjusting agent may be added to the solution in order for the solution to have a pH of from about 7.5 to about 11.0. The buffer may be boric acid or an ammonium salt, and the complexing agent may be an amino acid, a hydroxy acid, or an ammonium salt thereof.

Complexing agents that may be used in accordance with the disclosure include amino acids, hydroxy acids, or their ammonium salts. The complexing agent complexes with metal ions to make the solution more stable. Additional complexing agents that may be used include pyrophosphate salts, pyrophosphoric acid, and ammonium salts of pyrophosphoric acid. Additional examples include succinic acid, malic acid, glycine, tartaric acid, citric acid, and their ammonium salts.

A buffer may be added to the electroless plating solution in order to maintain the pH of the solution within a desired range. Buffer agents that may be used include boric acid, ammonium salts, and mixtures thereof. Examples of buffers include ammonium sulfate, ammonium chloride, and ammonium acetate.

In addition, the electroless plating solution may further include one or more surfactants and one or more stabilizers. The use of a surfactant or stabilizer is optional. Any suitable surfactant can be chosen for use in the present invention as long as the surfactant does not adversely interfere with the deposition process. Stabilizers may include organic sulfurous compounds, e.g., thiourea and benzosulfimide.

Typical plating solutions contain about 10-30 g/L of Co; about 2-20 g/L of W; about 0.1-10 g/L of B; about 1-10 g/L of P; about 20-40 g/L of boric acid; about 0.01-1 g/L of surfactant and about 0.1-2 mole of complexing agent.

In a preferred embodiment, when forming a cobalt-tungsten alloy layer without the use of a catalyst, the process first includes the step of cleaning a substrate using any suitable cleaner, which may be a suitable oxidizer. After the cleaning, the substrate may be rinsed in distilled water and then cleaned again using a weak acid. After the plating process is completed, the plated substrate can then be rinsed in distilled water and dried for subsequent processing FIG. 6 illustrates another embodiment of a structure according to the present disclosure. In particular, the structure includes a substrate 10 having completely silicided ultrathin silicon or carbon bodies 20 located on substrate 10 and electrolessly plated metal 70 (unmerged) is provided on top of gate 40 and on top of and on the sidewalls of fins 20. The embodiment of FIG. 6 further includes gate 40 sandwiched between spacers 50. On top of gate 40 is silicide layer 60 and electrolessly plated metal 70. In this embodiment, the electrolessly plated metal 70 is not merged with the ultrathin silicon or carbon bodies 20.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

The foregoing description of the disclosure illustrates and describes the present disclosure. Additionally, the disclosure shows and describes only the preferred embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

What is claimed is:

1. A multigate structure which comprises:
a semiconductor substrate;
a plurality of ultra-thin silicon or carbon bodies of less than 10 nanometers thick located on the substrate;
a plurality of gate structures located between the plurality of ultra-thin silicon or carbon bodies and on top of the semiconductor substrate, wherein the plurality of gate structures comprises a plurality of gate electrodes;
dielectric spacers that electrically isolate the gates from the ultra-thin silicon or carbon bodies;
an electrolessly deposited metallic layer selectively located on the side surfaces and top surfaces of the ultra-thin silicon or carbon bodies and selectively located on top of the plurality of gate structures to make electrical contact with the ultra-thin silicon or carbon bodies and to minimize parasitic resistance, and wherein the ultra-thin silicon or carbon bodies and metallic layer located thereon form source and drain regions; and wherein the electrolessly deposited metallic layer electrically connects and merges with adjacent ultra-thin silicon or carbon bodies; and
further comprising a silicide layer of at least 2 nanometers and less than 20 nanometers thick located on the side surfaces and top surfaces of the ultra-thin silicon or carbon bodies intermediate the electrolessly deposited metallic layer; and
wherein the electrolessly deposited metallic layer is selected from the group consisting of cobalt-tungsten alloy (CoW), cobalt-tungsten-phosphorous alloy (CoWP), cobalt-tungsten-boron alloy, cobalt-tungsten-phosphorous-boron alloy (CoWBP), nickel phosphorus (NiP) alloy and nickel boron (NiB) alloy.

2. The multigate structure of claim 1 wherein the ultra-thin silicon or carbon bodies comprise fins, nanowires or nanotube.

3. The multigate structure of claim 1 wherein the substrate is a SOI substrate.

4. The multigate structure of claim 1 wherein the substrate is a silicon bulk substrate.

5. The multigate structure according to claim 1, wherein the ultra-thin silicon or carbon bodies are not completely merged.

6. The multigate structure according to claim 1, wherein the electrolessly deposited metallic layer is a cobalt-tungsten alloy (CoW).

7. The multigate structure according to claim 1, wherein the electrolessly deposited metallic layer is a cobalt-tungsten-phosphorous alloy (CoWP), a cobalt-tungsten-boron alloy or a cobalt-tungsten-phosphorous-boron alloy (CoWBP).

8. The multigate structure according to claim 1, wherein the electrolessly deposited metallic layer is a nickel phosphorus (NiP) or nickel boron (NiB) alloy.

9. The multigate structure according to claim 1, wherein the thin silicide layer is less than 10 nanometers thick.

10. The multigate structure according to claim 1, wherein the spacers are about 10 nanometers to about 20 nanometers thick.

11. The multigate structure according to claim 10, wherein the thin silicide layer is less than 10 nanometers thick.

12. The multigate structure according to claim 1, wherein the plurality of gate structures are parallel to each other.

* * * * *